United States Patent [19]
Yasuda et al.

[11] Patent Number: 5,841,388
[45] Date of Patent: Nov. 24, 1998

[54] A/D CONVERTER APPARATUS WITH FREQUENCY CONVERSION FUNCTION AND RADIO APPARATUS USING THE SAME

[75] Inventors: Akira Yasuda, Kawasaki; Tetsuro Itakura, Tokyo; Takafumi Yamaji, Ichikawa, all of Japan

[73] Assignee: Kabushiki Kaisha Toshiba, Kawasaki, Japan

[21] Appl. No.: 527,638

[22] Filed: Sep. 13, 1995

[30]     Foreign Application Priority Data

Sep. 14, 1994  [JP]  Japan .................................. 6-220643

[51] Int. Cl.$^6$ ...................................................... H03M 3/00
[52] U.S. Cl. ........................ 341/155; 341/118; 375/243; 375/244; 375/247
[58] Field of Search ...................... 375/261, 298; 455/20, 75, 118, 313, 21, 207, 310; 348/572; 341/110, 126, 144, 155, 127, 128, 143

[56]               References Cited

U.S. PATENT DOCUMENTS

| | | |
|---|---|---|
| 3,936,763 | 2/1976 | Palmer . |
| 4,107,669 | 8/1978 | Tewksbury . |
| 4,186,384 | 1/1980 | Acker . |
| 4,862,169 | 8/1989 | Van Bavel et al. . |
| 4,937,577 | 6/1990 | Rich et al. . |
| 4,977,403 | 12/1990 | Larson . |
| 5,101,205 | 3/1992 | Yasuda . |
| 5,140,325 | 8/1992 | Yu et al. ................................. 341/143 |
| 5,153,593 | 10/1992 | Walden et al. ......................... 341/143 |
| 5,162,799 | 11/1992 | Tanimoto . |
| 5,181,032 | 1/1993 | Ribner .................................... 341/143 |
| 5,305,004 | 4/1994 | Fattaruso ................................ 341/120 |
| 5,311,181 | 5/1994 | Ferguson, Jr. et al. ................. 341/143 |
| 5,369,403 | 11/1994 | Temes et al. ........................... 341/143 |
| 5,471,209 | 11/1995 | Sutterlin et al. ....................... 341/143 |
| 5,565,868 | 10/1996 | Azrouf et al. .......................... 341/155 |

Primary Examiner—Wellington Chin
Assistant Examiner—Jean B. Corrielus
Attorney, Agent, or Firm—Oblon, Spivak, McClelland, Maier & Neustadt, P.C.

[57]               ABSTRACT

An A/D converter apparatus comprising a negative feedback loop having a main signal line supplied with an input signal of a predetermined frequency and a feedback signal line passing through a feedback signal, a A/D converter connected to the main signal line for frequency-converting the input signal to a signal having a frequency different from that of the input signal to output a converted signal, a D/A converter connected to the feedback signal line for frequency-converting the feedback signal to a signal having a frequency substantially equal to that of the input signal, and a subtracter for subtracting the feedback signal from the D/A converter from the input signal to supply a subtraction result signal to the A/D converter.

12 Claims, 7 Drawing Sheets

A/D CONVERTER APPARATUS WITH FREQUENCY CONVERSION FUNCTION AND RADIO APPARATUS USING THE SAME

BACKGROUND OF THE INVENTION

1. Field of the Invention

The present invention relates to an A/D converter apparatus with a frequency conversion function and a radio apparatus using the same.

2. Description of the Related Art

When a receiver of a direct conversion scheme executes demodulation through digital processing, an input modulated signal is input to a mixer via a filter for channel selection, it is converted to have a lower frequency than its original frequency by a frequency converter, which is constituted by this mixer and a reference signal generator, and the resultant signal is then input to an A/D converter. The digital signal output from the A/D converter is demodulated by a demodulator to restore the original baseband signal.

In a radio apparatus, the signal frequency band is generally narrower than the carrier frequency, so that the sampling frequency in the A/D converter can be reduced by down-converting the input modulated signal and then performing A/D conversion thereof in the aforementioned manner. In other words, a slower and cheaper A/D converter can be used.

In this case, to obtain the proper demodulated output, the mixer should have a low distortion ratio and low noise. Since the input to the mixer is a modulated signal which has been received via a radio transmission path, its level varies in a wide range. As a mixer is generally constituted by a nonlinear circuit, however, it is difficult to design the mixer with a low distortion ratio over a wide input-level range.

As described above, the A/D converter designed to perform A/D conversion after the frequency conversion of the input modulated signal is disadvantageous in that the frequency converter should have a low distortion ratio over a wide input-level range and low noise.

SUMMERY OF THE INVENTION

It is an object of the present invention to provide an A/D converter apparatus with a frequency conversion function, which can be realized without requiring a frequency converter having a low distortion ratio over a wide input-level range and low noise, and a radio apparatus using the same.

According to a first aspect of the present invention, there is provided an A/D converter apparatus comprising a negative feedback loop, an A/D converter connected to the main signal line of the negative feedback loop and having a first frequency conversion function for frequency-converting the frequency of the input signal to a frequency different from the frequency of the input signal, a D/A converter connected to a feedback signal line of the feedback loop and having a function for frequency-converting the frequency of the feedback signal to the frequency substantially equal to that of the input signal, and a subtraction circuit for subtracting from the input signal the feedback signal transferred from the D/A converter to the feedback line and inputting a subtraction result signal to the A/D converter.

According to a second aspect of the present invention, there is provided an A/D converter apparatus which comprises a subtraction circuit for subtracting a second signal as a feedback signal from a first signal as an input signal and outputting a third signal, an A/D conversion circuit for converting the third signal to a digital signal, a D/A conversion circuit for converting the digital signal from the A/D conversion circuit to an analog signal, a feedback circuit for feeding the analog signal from the D/A conversion circuit back to the subtraction circuit as the second signal, a first frequency conversion circuit for rendering the third signal to have a predetermined frequency different from a frequency of the first signal, and a second frequency conversion circuit for rendering the second signal to have substantially the same frequency as that of the first signal.

According to a third aspect of the present invention, there is an A/D converter apparatus which comprises a subtraction circuit for subtracting a second signal from a first signal to obtain a third signal, a first quadrature modulation circuit for converting the third signal to two quadrature-modulated signals having frequencies different from a frequency of the first signal, first and second A/D conversion circuits for respectively converting the two frequency-converted signals from the first quadrature modulation circuit to digital signals, first and second D/A conversion circuits for respectively converting the digital signals from the first and second A/D conversion circuits to analog signals, a second quadrature modulation circuit for converting the analog signals from the first and second D/A conversion circuits to two quadrature signals and adding the two quadrature signals to obtain an output signal having substantially the same frequency as the frequency of the first signal, and a feedback circuit for feeding the output signal of the second quadrature modulation circuit back to the subtraction circuit as the second signal.

According to a fourth aspect of the present invention, there is provided a radio communication equipment which comprises a receiver circuit for receiving a high-frequency signal; an A/D converter apparatus comprising a negative feedback loop, an A/D converter connected to the main signal line of the negative feedback loop and having a first frequency conversion function for frequency-converting the frequency of the input signal to a frequency different from the frequency of the input signal, a D/A converter connected to a feedback signal line of the feedback loop and having a function for frequency-converting the frequency of the feedback signal to the frequency substantially equal to that of the input signal, and a subtraction circuit for subtracting from the input signal the feedback signal transferred from the D/A converter to the feedback line and inputting a subtraction result signal to the A/D converter; and a demodulation circuit for demodulating an output signal of the A/D converter apparatus.

The A/D converter apparatus with a frequency conversion function according to this invention is designed to form a negative feedback loop as a whole, with the first frequency converter inserted in the main signal line of this loop. Accordingly, the influence of the imperfect or unsatisfactory distortion ratio characteristic and noise characteristic of the first frequency converter is improved by the gain of the negative feedback loop. This relaxes the requirement regarding the characteristic to be imposed on the first frequency converter.

Since the second frequency converter is provided in the feedback signal line, it requires excellent characteristics with respect to distortion ratio characteristic and noise characteristic. However, since the second frequency conversion function is performed for the signals subjected to A/D conversion and D/A conversion, whose signal level is specified in a variation range, the second frequency converter having a low distortion ratio characteristic and a low noise characteristic can easily realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Preferred embodiments of the present invention will now be described with reference to the accompanying drawings.

Figure 1:
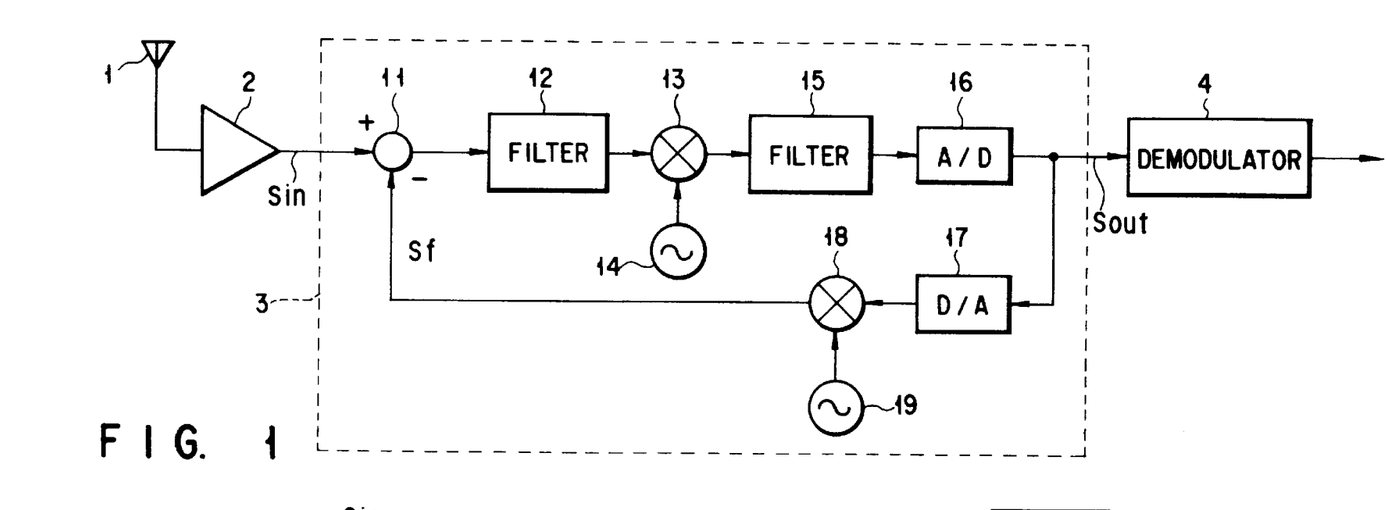
FIG. 1 is a block diagram showing the structure of a radio communication equipment including an A/D converter apparatus according to a first embodiment.

FIG. 1 presents a block diagram showing the structure of a radio communication equipment including an A/D converter apparatus according to the first embodiment. In FIG. 1, an RF signal (demodulated signal) received at an antenna 1 is input via a preamplifier 2 to an A/D converter apparatus 3 where the RF signal is converted to have a predetermined frequency lower than the frequency of the RF signal and is then converted to a digital signal. This digital signal is input to a demodulator 4 to be demodulated.

The A/D converter apparatus 3 comprises a subtracter 11, a loop filter 12, a mixer 13, a reference signal generator 14, a filter 15, an A/D converter 16, a D/A converter 17, a mixer 18 and a reference signal generator 19, all of which form a negative feedback loop. The mixer 13 and the reference signal generator 14 constitute a first frequency converter (down converter) which converts the output signal of the subtracter 11 to have a predetermined frequency lower than the frequency of an input signal Sin. The mixer 18 and the reference signal generator 19 constitute a second frequency converter (upper converter) which converts a feedback signal Sf supplied to the subtracter 11 to a signal having substantially the same frequency as that of the input signal Sin.

The operation of the A/D converter apparatus 3 according to this embodiment will now be described.

The subtracter 11 subtracts the feedback signal Sf, which is produced in a manner described later, from the input signal Sin to the A/D converter apparatus 3. The output of this subtracter 11 is input via the loop filter 12 to the mixer 13 and is multiplied by a reference signal from the reference signal generator 14 to have a predetermined frequency lower than the frequency of the input signal Sin, e.g., a frequency in the band of the baseband signal or an intermediate frequency.

The output of the mixer 13 or the output of the first frequency converter contains a predetermined frequency component as well as an unnecessary harmonic component which is higher than the predetermined frequency component. In this respect, the output of the mixer 13 is input to the A/D converter 16 via the filter 15 (generally low-pass filter), which removes such an unnecessary frequency component and passes only the predetermined frequency component, and is converted to a digital signal. In this case, because the A/D converter 16 converts the analog signal, converted to have a lower frequency by the mixer 13, to a digital signal, it may be of a slower type having a low sampling frequency as compared with the case where the input signal Sin (modulated signal) having a high frequency is directly converted to a digital signal. This structure can therefore reduce consumed power.

The output of the A/D converter 16 is supplied as the output Sout of the A/D converter apparatus 3 to the demodulator 4, and is also input to the D/A converter 17 to be converted to an analog signal. The output of the D/A converter 17 is input to the mixer 18 and is multiplied by a reference signal from the reference signal generator 19 to have substantially the same frequency as the frequency of the input signal Sin (carrier frequency). The output of the mixer 18 or the output of the second frequency converter is fed back as the feedback signal Sf to the subtracter 11.

It is apparent from the above that the A/D converter apparatus of this embodiment takes the form of a so-called noise-shaping type A/D converter (also called a Δ Σ type A/D converter) and forms a negative feedback loop as a whole. The first frequency converter comprising the mixer 13 and the reference signal generator 14 is inserted in the main signal line of this loop or the signal line extending from the input of the A/D converter apparatus to the output thereof. The imperfect characteristic of the mixer 13, i.e., the influence of the distortion ratio characteristic and noise characteristic of the mixer 13 to the input signal is suppressed by the action of the negative feedback. The suppression of distortion and noise present in the main signal line of the negative feedback loop is apparent from the theory of the negative feedback circuit.

Since the second frequency converter comprising the mixer 18 and the reference signal generator 19 is inserted in the feedback signal line of the negative feedback loop, the distortion or noise generated in the mixer 18 directly affects the precision of the feedback signal Sf. This requires that the mixer 18 should have an excellent low distortion ratio characteristic and excellent low noise characteristic. The input to the mixer 13 is the received modulated signal which has passed the subtracter 11 and filter 12 and the range of its level change is very wide, whereas the input to the mixer 18 is the signal which has passed the A/D converter 16 and the D/A converter 17 and has a specific narrow level range determined by the number of conversion bits of the A/D converter 16. That is, the mixer 18 is used in a narrow level range where a change in its input level is limited, so that the mixer 18 can easily be designed to have a low distortion ratio characteristic and low noise characteristic.

According to this embodiment, the frequency of the reference signal supplied to the mixer 13 from the reference signal generator 14 can be selected arbitrarily; for example, the frequency has only to be selected to the frequency which is not so susceptible to the influence of an image signal or the frequency which is easily handled by the A/D converter 16, as in a superheterodyne system.

The sampling frequency of the A/D converter 16 (the frequency of the sampling clock to be supplied to the A/D converter 16) should be so set as to permit the output signal of the desired frequency component of the filter 15 to be converted to a digital signal.

When the carrier frequency of the output of the mixer 13 is higher than the signal band of the input signal (modulated signal), the sampling frequency of the A/D converter 16 may be set lower than this carrier frequency. When the sampling frequency of the A/D converter 16 is set in this manner, the output of the mixer 13 is folded within the signal band, i.e., subjected to an aliasing in the A/C converter 16. This is equivalent to the frequency conversion. When the sampling frequency of the A/D converter 16 is selected to be an integer fraction of the carrier frequency of the output of the mixer 13, for instance, the output of the mixer 13 is converted to have a baseband frequency. When the selected sampling frequency of the A/D converter 16 does not meet this relation, on the other hand, the output of the mixer 13 is converted to have an intermediate frequency. In the latter case, the output of the A/D converter 16 should be subjected to the proper digital processing in the demodulator 4 to be demodulated.

Figure 2:
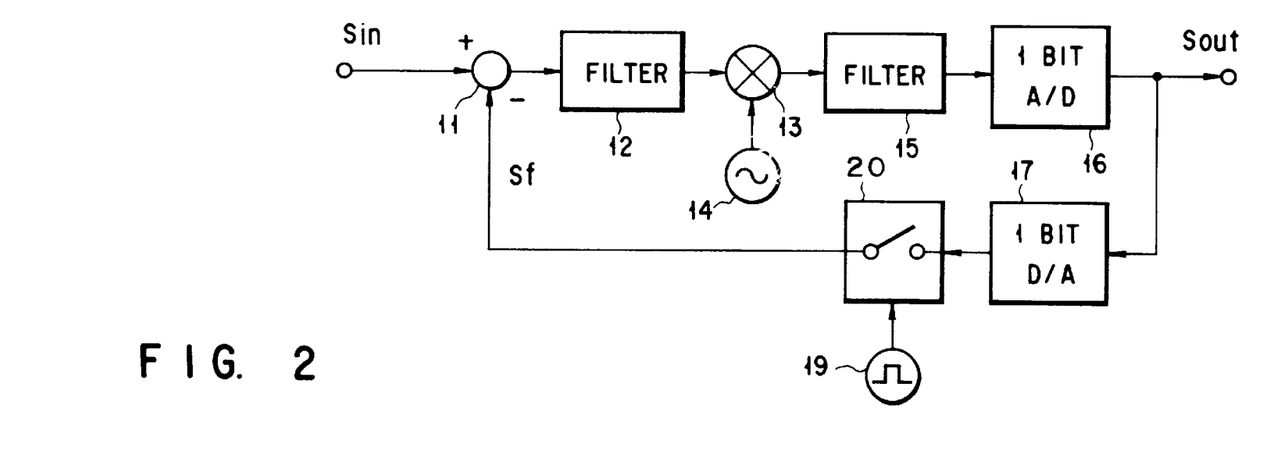
FIG. 2 is a block diagram showing the structure of an A/D converter apparatus according to a second embodiment.

FIG. 2 illustrates a concrete embodiment of the A/D converter apparatus 3 shown in FIG. 1. This embodiment uses a 1-bit A/D converter for the A/D converter 16 and uses a 1-bit D/A converter for the D/A converter 17. In this case, the input to the mixer 18 is a 1-bit signal from the D/A converter 17, so that the mixer 18 may be embodied as a switch 20 if the output of the reference signal generator 19 is a 1-bit signal or has a square wave. Concretely, the one-bit D/A converter 17 and the mixer 18 function as an integrated unit and converts a one-bit signal from the A/D converter 16 to an analog signal in synchronism with the rectangular pulse from the reference signal generator 19. The one-bit A/D converter 16 comprises a comparator for comparing the input signal with a predetermined level. The mixer embodied as a switch 20 does not theoretically generate distortion, so that it can be realized more easily than the mixer constituted of an ordinary multiplier.

Even when the A/D converter 16 and D/A converter 17 have a relatively small-bit structure like a 2-bit or 3-bit structure, the mixer can be embodied as switches. Further, even when the A/D converter 16 and D/A converter 17 have a multi-bit structure having four or more bits, the mixer can be embodied as switches though it suffers an increased number of switches.

Figure 3:
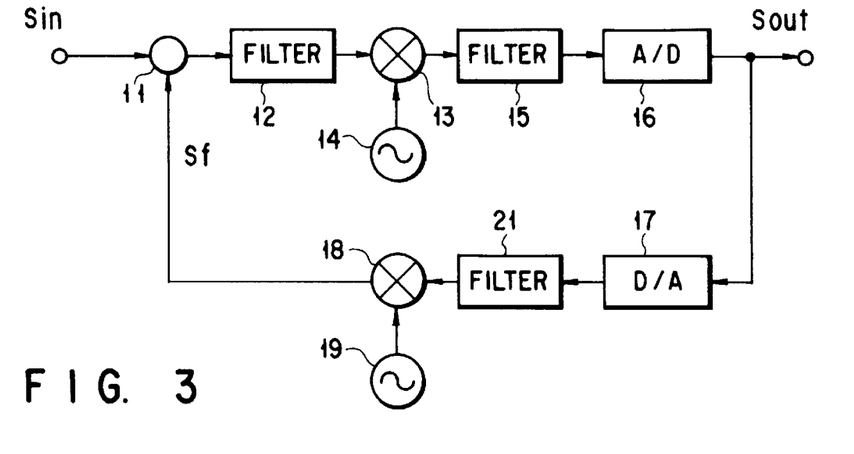
FIG. 3 is a block diagram showing the structure of an A/D converter apparatus according to a third embodiment.

FIG. 3 shows the structure of an A/D converter apparatus according to the third embodiment, which differs from the embodiment in FIG. 1 in that a filter 21 (e.g., low-pass filter) for attenuating the harmonic component included in the output of the D/A converter 17 is inserted between the D/A converter 17 and the mixer 18. The provision of this filter 21 can improve the precision of the feedback signal Sf, thus ensuring highly accurate A/D conversion.

Figure 4:
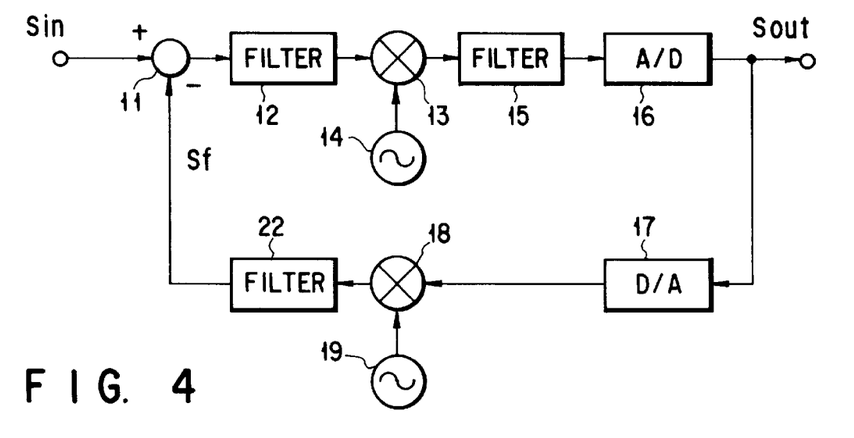
FIG. 4 is a block diagram showing the structure of an A/D converter apparatus according to a fourth embodiment.

FIG. 4 shows the structure of an A/D converter apparatus according to the fourth embodiment, which differs from the embodiment in FIG. 1 in that a filter 22 (e.g., bandpass filter) for attenuating the harmonic component included in the output of the mixer 18 is inserted between the mixer 18 and the subtracter 11. The provision of this filter 22 can improve the precision of the feedback signal Sf, thus ensuring highly accurate A/D conversion, as per the embodiment in FIG. 3.

Figure 5:
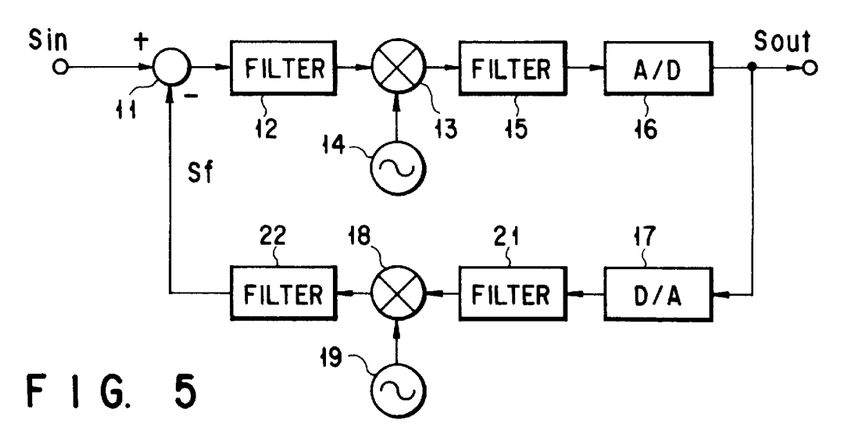
FIG. 5 is a block diagram showing the structure of an A/D converter apparatus according to a fifth embodiment.

FIG. 5 shows the structure of an A/D converter apparatus according to the fifth embodiment, which is a combination of the embodiment in FIG. 3 and the embodiment in FIG. 4. In other words, the filter 12, mixer 13, filter 15 and A/D converter 16 are provided in the main signal line of the feedback loop, and the filter 22, mixer 18, filter 21 and A/D converter 17 are provided in the feedback signal line. The provision of both filters 21 and 22 to the feedback signal line can further improve the precision of the feedback signal Sf.

Figure 6:
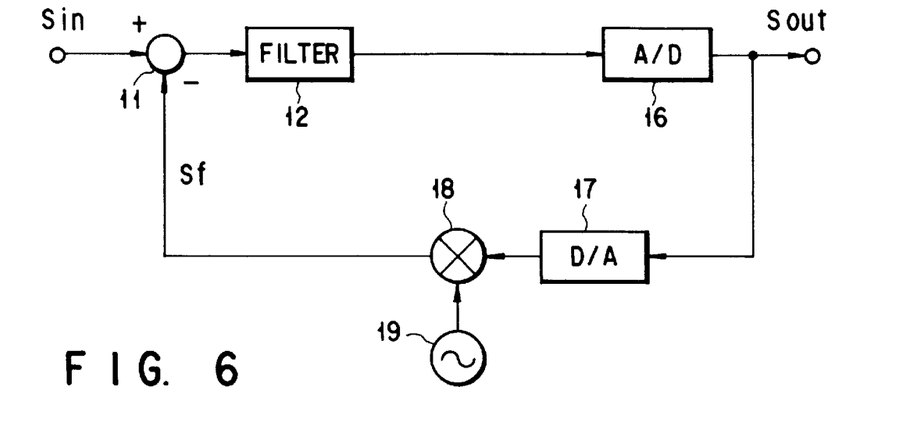
FIG. 6 is a block diagram showing the structure of an A/D converter apparatus according to a sixth embodiment.

FIG. 6 shows the structure of an A/D converter apparatus according to the sixth embodiment, which eliminates the first frequency converter comprising the mixer 13 and the reference signal generator 14 which is provided in the FIG. 1 embodiment and allows the sampling function of the A/D converter 16 to serve as the first frequency converter. In this embodiment, the sampling frequency of the A/D converter 16 is set lower than the carrier frequency of the input signal Sin to provide the A/D converter 16 with the function of the first frequency converter. The filter 12 may be a bandpass filter which passes the frequency component around the carrier frequency of the input signal Sin.

It is known that when sampling is performed in an A/D converter with a lower frequency than the frequency of the input signal, the input signal component is turned back to a frequency band which is a half the sampling frequency, i.e., subjected to an aliasing. If the sampling frequency of the A/D converter 16 is set to the proper frequency lower than the carrier frequency of the input signal Sin within a range where the sideband component of the input signal Sin is not turned back, the input signal Sin can be converted by the A/D converter 16 as a turned-back component to have a lower frequency than the frequency of the input signal Sin.

According to this embodiment, therefore, the A/D converter 16 is permitted to serve as the first frequency converter, thus contributing to the reduction of the hardware scale and the cost. Further, the sampling frequency can be lowered, the consumed power can be reduced.

Figure 7:
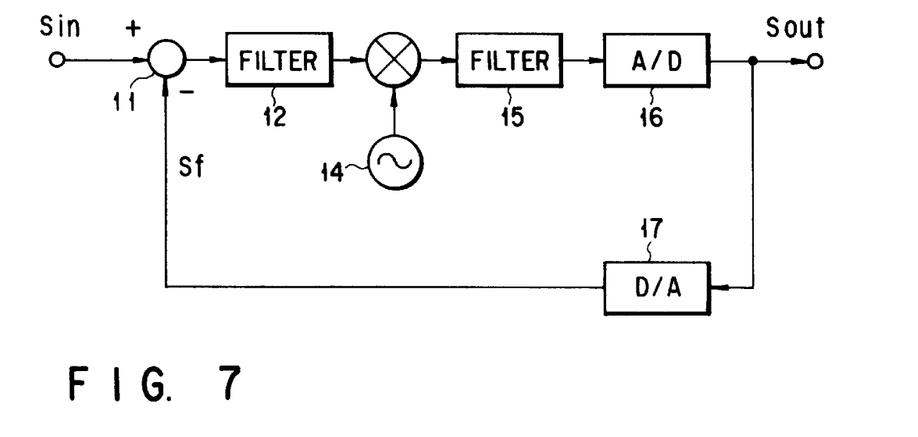
FIG. 7 is a block diagram showing the structure of an A/D converter apparatus according to a seventh embodiment.

FIG. 7 shows the structure of an A/D converter apparatus according to the seventh embodiment, which eliminates the second frequency converter comprising the mixer 18 and the reference signal generator 19 and allows the D/A converter 17 to serve as the second frequency converter. In this embodiment, the output of the D/A converter 17 is realized by the zero order hold; that is, it is assumed that the output section of the D/A converter does not include a smoothing low-pass filter as is true in many D/A converters. In this case, because the output of the D/A converter 17 becomes an analog signal having a square wave (step wave), it contains the harmonic component or the frequency component whose frequency is an integer multiple of the sampling frequency.

Therefore, the use of the signal component in the output of the D/A converter 17, which has the same frequency as that of the input signal Sin, as the feedback signal Sf can eliminate the second frequency converter. If the width of the output pulse of the D/A converter 17 is narrowed, the energy of the harmonic component can be increased. This is advantageous in providing the D/A converter 17 with the function of the second frequency converter.

According to this embodiment, therefore, the output section of the D/A converter 17 is permitted to serve as the second frequency converter, thus contributing to the reduction of the hardware scale and the cost.

Figure 8:
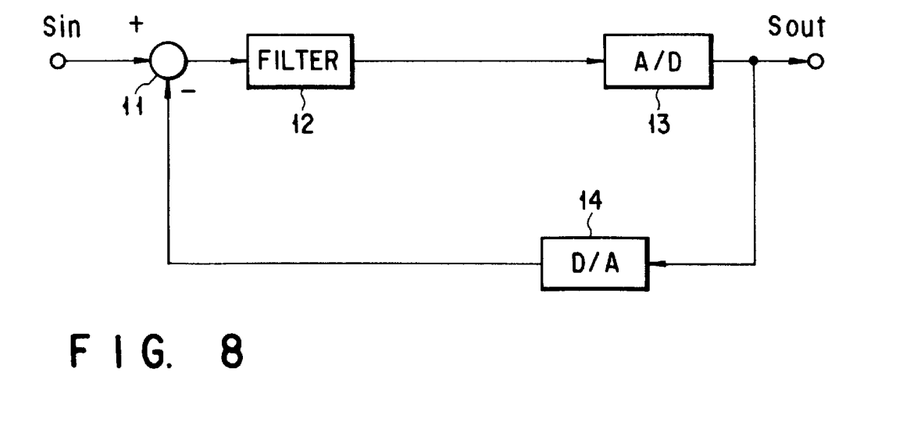
FIG. 8 is a block diagram showing the structure of an A/D converter apparatus according to an eighth embodiment.

FIG. 8 shows the structure of an A/D converter apparatus according to the eighth embodiment, which is a combination of the structure shown in FIG. 6 that permits the A/D converter 16 to serve as the first frequency converter and the structure shown in FIG. 7 that permits the D/A converter 17 to serve as the second frequency converter. In other words, the filter 12 and A/D converter 13 are connected to the main signal line of the feedback loop and the D/A converter 14 is connected to the feedback signal line. The A/D converter 13 has a first frequency conversion function for frequency-converting the input signal to an signal having a frequency different from the input signal frequency. The D/A converter 14 has a second frequency conversion function for frequency-converting the feedback signal to an signal having a frequency substantially equal to the input signal frequency. In a case of this embodiment, the D/A converter 14 is constructed so that an integer multiple of the sampling frequency of the D/A converter 14 is equal to the frequency of the input signal, i.e., the sampling frequency is equal to an integer fraction of the input signal frequency.

This embodiment needs no special hardware as the first frequency converter and the second frequency converter, thus considerably reducing the hardware scale.

Figure 9:
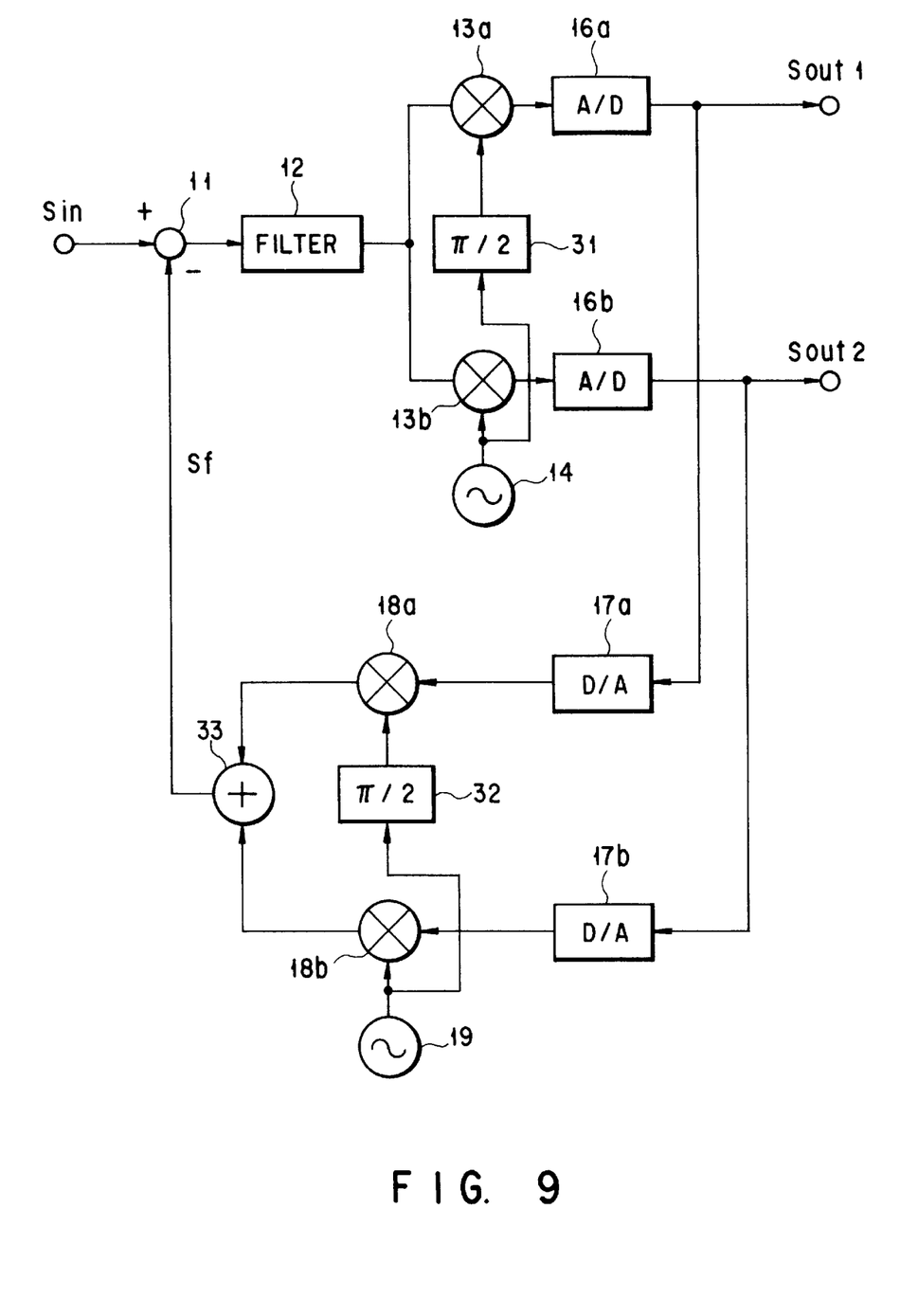
FIG. 9 is a block diagram showing the structure of an A/D converter apparatus according to a ninth embodiment.

FIG. 9 shows the structure of an A/D converter apparatus according to the ninth embodiment, which uses a quadrature modulator for the first and second frequency converters. The first frequency converter comprises two mixers 13a and 13b, which receive the output of the filter 12, the reference signal generator 14 which respectively supplies orthogonal reference signals to the mixers 13a and 13b, and a π/2 phase shifter 31. This first frequency converter provides two frequency-converted outputs.

As the first frequency converter is constituted of a quadrature modulator, there are two sets of A/D converters and D/A converters. More specifically, the outputs of the mixers 13a and 13b of the first quadrature modulator are respectively input to A/D converters 16a and 16b. The outputs of the A/D converters 16a and 16b are taken as orthogonal A/D conversion outputs Sout1 and Sout2, which are in turn input to D/A converters 17a and 17b, respectively.

The second quadrature modulator comprises two mixers 18a and 18b which receive the outputs of the D/A converters 17a and 17b, the reference signal generator 19 which supplies orthogonal reference signals to the mixers 18a and 18b, a π/2 phase shifter 32, and an adder 33 which adds the outputs of the mixers 18a and 18b. The output of the adder 33 is fed back as the feedback signal Sf to the subtracter 11.

This embodiment can basically have the same advantages as the first embodiment shown in FIG. 1. As the first quadrature modulator comprising the mixers 13a and 13b, the reference signal generator 14 and π/2 phase shifter 31 is inserted in the main signal line of the negative feedback loop, the influence of the imperfect characteristics of the mixers 13a and 13b is suppressed by the action of the negative feedback. Because the second frequency converter comprising the mixers 18a and 18b, the reference signal generator 19 and the π/2 phase shifter 32 is inserted in the feedback signal line of the sampling frequency, the mixers 18a and 18b require an excellent low distortion ratio characteristic and excellent low noise characteristic. Since the inputs to the mixers 18a and 18b are the signals which have passed the A/D converters 16a and 16b and the D/A converters 17a and 17b and their level range is a specifically limited one which is determined by the number of conversion bits of the A/D converters 16a and 16b, however, the low distortion ratio characteristic and low noise characteristic can easily be realized.

In this embodiment, it is also possible to arbitrarily select the frequencies of the reference signals to be supplied to the mixers 13a and 13b. When the frequencies of the reference signals are selected to be an integer fraction of the sampling frequency of the input signal Sin, the input signal Sin is converted to a baseband signal by the mixers 13a and 13b. In the embodiment in FIG. 1, if such a reference signal frequency is selected, both sideband waves of the input signal Sin are both turned back to the baseband in the mixer 13, so that both the amplitude component and phase component of the input signal Sin cannot be demodulated. In this embodiment, however, the user of the quadrature modulator for the first frequency converter permits both the amplitude and phase components to be converted by the first quadrature modulator and to be demodulated via the A/D converters 16a and 16b and the demodulator.

Figure 10:
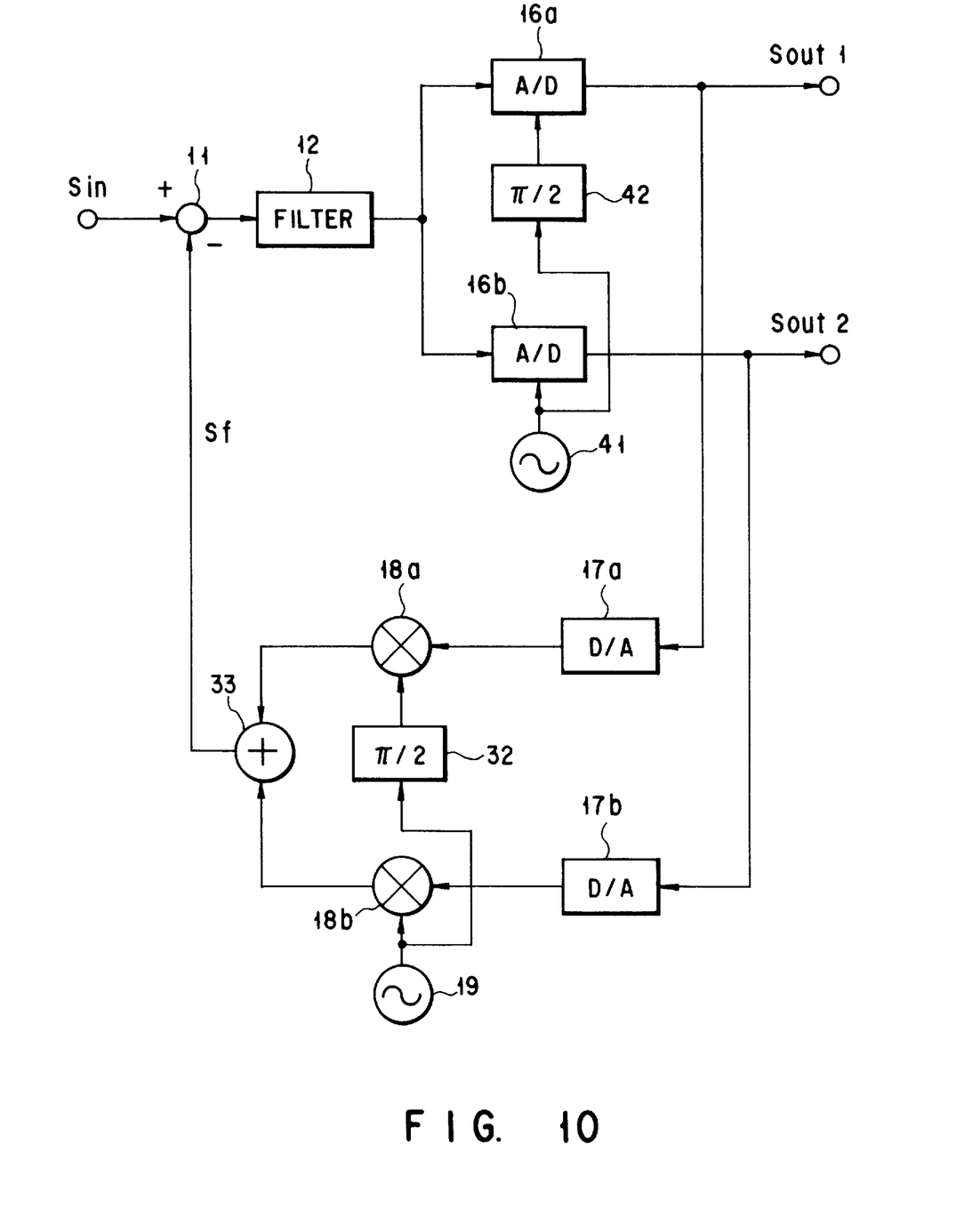
FIG. 10 is a block diagram showing the structure of an A/D converter apparatus according to a tenth embodiment.

FIG. 10 shows the structure of an A/D converter apparatus according to the tenth embodiment, which is designed to permit the A/D converters 16a and 16b to serve the first quadrature modulator by causing a clock generator 41 and a π/2 phase shifter 42 to supply orthogonal sampling clocks to the A/D converters 16a and 16b. This embodiment therefore requires no special hardware for the first quadrature modulator, thus contributing to the simplification of the structure and the cost reduction.

Since the A/D converters 16a and 16b are inserted in the main signal line of the negative feedback loop, any error cased by those A/D converters 16a and 16b does not affect the precision of the A/D conversion much even if the A/D converters 16a and 16b are given the function of the first quadrature modulator.

Since the second frequency converter comprises the mixers 18a and 18b, the reference signal generator 19 and a π/2 phase shifter 42 as in the embodiment in FIG. 9, the precision of the feedback signal Sf is also improved.

Figure 11:
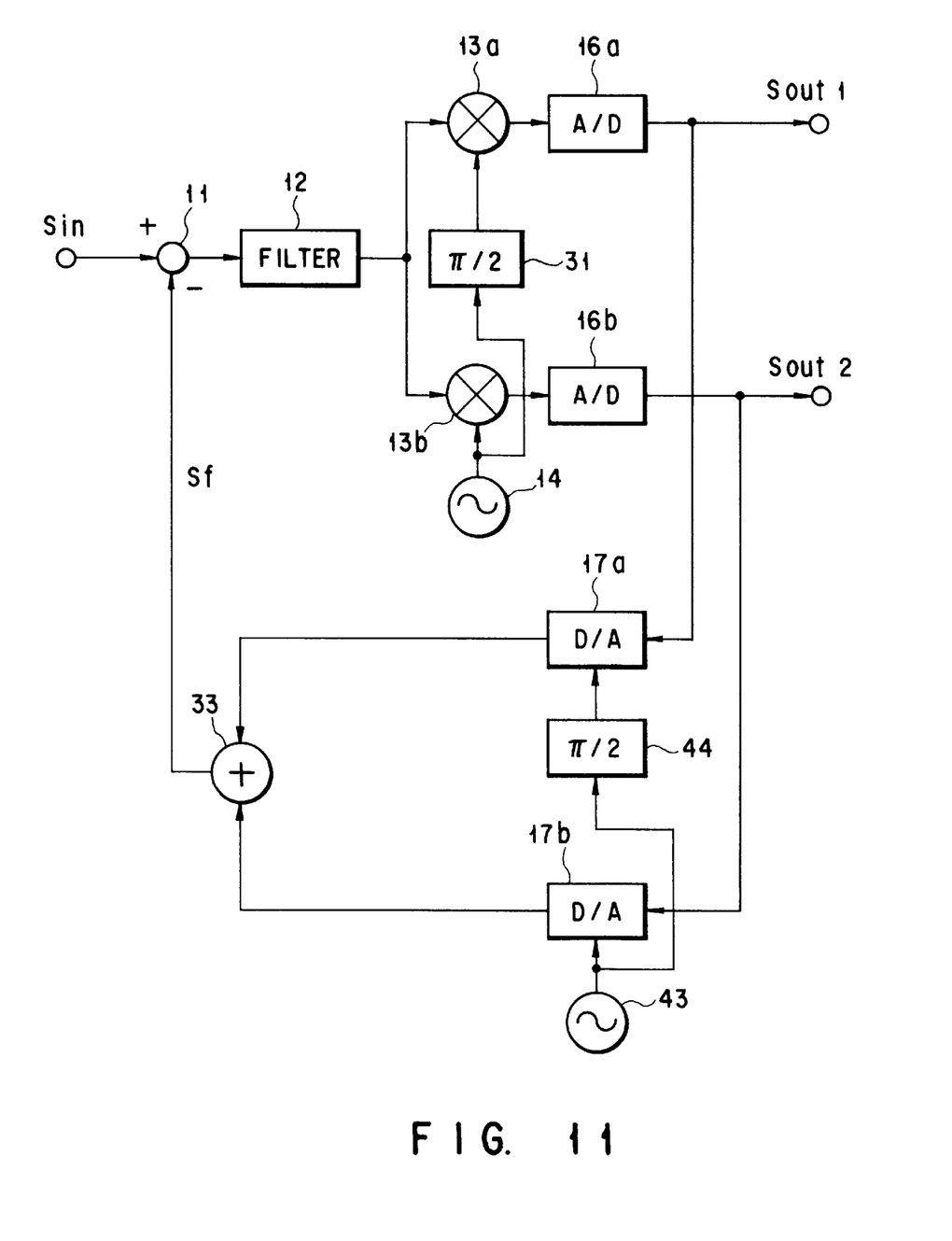
FIG. 11 is a block diagram showing the structure of an A/D converter apparatus according to an eleventh embodiment.

FIG. 11 shows the structure of an A/D converter apparatus according to the eleventh embodiment, which is designed to permit the D/A converters 17a and 17b to serve the second quadrature modulator by causing a clock generator 43 and a π/2 phase shifter 44 to supply quadrature conversion clocks to the D/A converters 17a and 17b and by changing the output timings of the D/A converters 17a and 17b. This embodiment therefore requires no special hardware for the second quadrature modulator, thus contributing to the simplification of the structure and the cost reduction.

Figure 12:
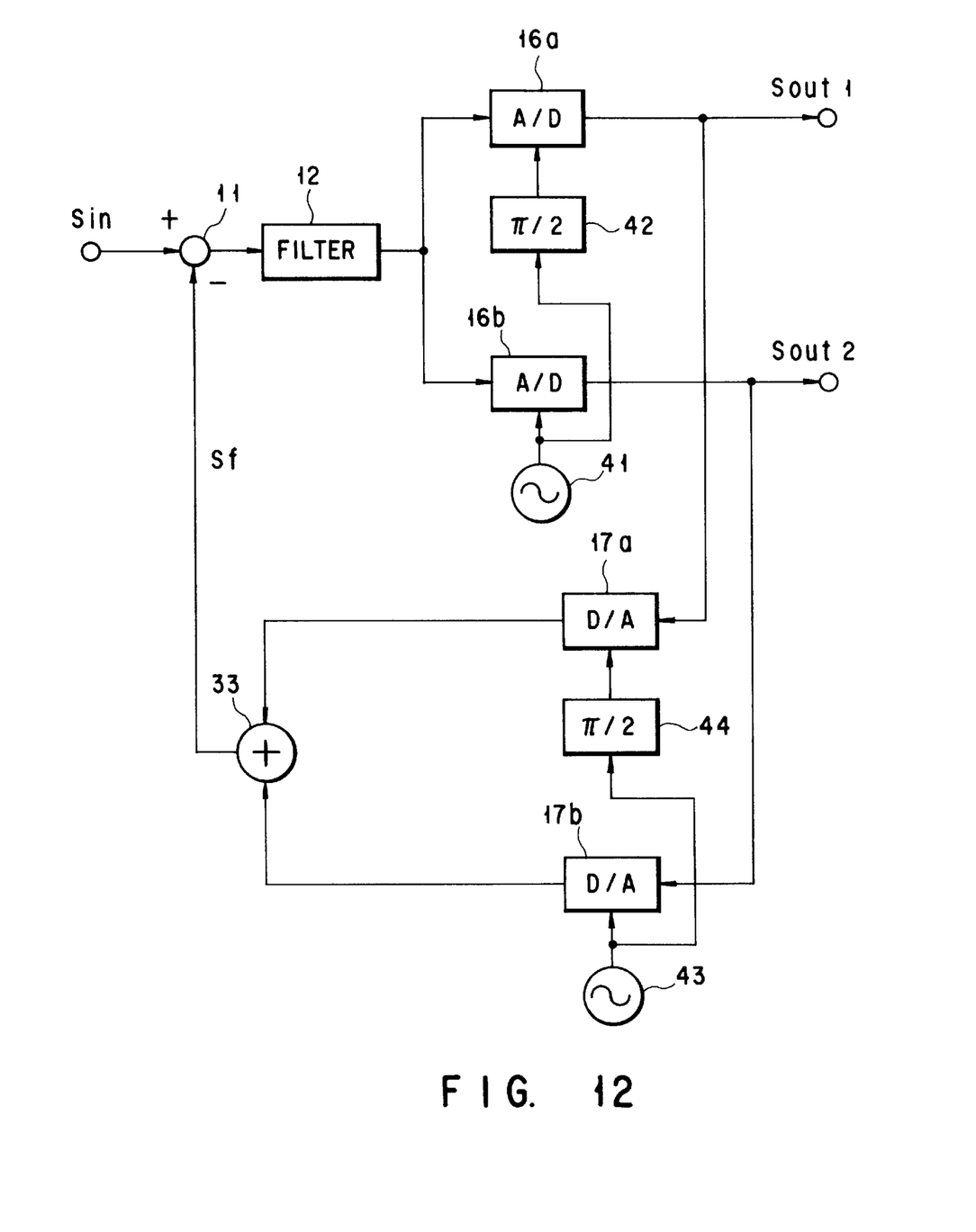
FIG. 12 is a block diagram showing the structure of an A/D converter apparatus according to a twelfth embodiment.

FIG. 12 shows the structure of an A/D converter apparatus according to the twelfth embodiment, which is a combination of the structure shown in FIG. 10 that permits the A/D converters 16a and 16b to serve as the first quadrature modulator and the structure shown in FIG. 11 that permits the D/A converters 17a and 17b to serve as the second quadrature modulator.

This embodiment needs no special hardware as the first frequency converter and the second frequency converter, thus considerably reducing the hardware scale.

As described above, the A/D converter apparatus with a frequency conversion function according to this invention forms a negative feedback loop as a whole, with the first frequency converter provided in the main signal line of this loop and the second frequency converter provided in the feedback signal line where the signal which has passed the A/D converter and D/A converter is input, this A/D converter apparatus can easily be realized without requiring a frequency converter having an excellent distortion ratio characteristic over a wide input-level range and an excellent noise characteristic.

According to this invention, it is also possible to provide a simple and low-cost radio apparatus which uses such an A/D converter apparatus with a frequency conversion function.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An A/D converter apparatus comprising:
   a negative feedback loop having a main signal line supplied with an input signal of a predetermined frequency and a feedback signal line receiving a feedback signal;
   A/D conversion means connected in said main signal line and having a first frequency conversion function for frequency-converting the input signal to a frequency-converted signal having a frequency different from that of the input signal;
   D/A conversion means connected in said feedback signal line and having a second frequency conversion function for frequency-converting the feedback signal to a frequency-converted feedback signal having a frequency substantially equal to that of the input signal; and
   subtraction means for subtracting the frequency-converted feedback signal from said D/A conversion means from the input signal to supply a subtraction result signal to said A/D conversion means, and
   wherein said D/A conversion means comprises a D/A converter for sampling the frequency-converted signal received from said A/D conversion means as the feedback signal in accordance with a sampling frequency corresponding to an integer fraction of the frequency of the input signal.

2. An A/D converter apparatus according to claim 1, wherein said D/A converter has a function of narrowing a pulse width of the frequency-converted feedback signal.

3. An A/D converter apparatus comprising:
   a negative feedback loop having a main signal line supplied with an input signal of a predetermined frequency and a feedback signal line receiving a feedback signal;
   A/D conversion means including a frequency converter connected to said main signal line for frequency-converting the input signal to a frequency-converted signal having a frequency lower than that of the input signal and an A/D converter for A/D-converting the frequency-converted signal of said frequency converter;
   D/A conversion means connected in said feedback signal line and having a frequency conversion function for frequency-converting the feedback signal to a frequency-converted feedback signal having a frequency substantially equal to that of the input signal; and
   subtraction means for subtracting the frequency-converted feedback signal from said D/A conversion means from the input signal to supply a subtraction result signal to said A/D conversion means.

4. An A/D converter apparatus according to claim 3, wherein said frequency converter comprises a reference signal generator for generating a reference signal and a mixer for multiplying the input signal by the reference signal.

5. An A/D converter apparatus comprising:
   a negative feedback loop having a main signal line supplied with an input signal of a predetermined frequency and a feedback signal line receiving a feedback signal;
   A/D conversion means including a first frequency converter for frequency-converting the input signal to a frequency-converted signal having a frequency lower than that of the input signal and an A/D converter for A/D-converting the frequency-converted signal from said first frequency converter;
   D/A conversion means including a D/A converter connected to the feedback signal line for D/A-converting the feedback signal and a second frequency converter for frequency-converting an output signal from said D/A converter to a frequency-converted feedback signal having a frequency substantially equal to that of the input signal; and
   subtraction means for subtracting the frequency-converted feedback signal from said D/A conversions means from the input signal to supply a subtraction result signal to said A/D conversion means.

6. An A/D converter apparatus according to claim 5, wherein said first frequency converter comprises a reference signal generator for generating a reference signal and a mixer for multiplying the input signal by the reference signal.

7. An A/D converter apparatus according to claim 5, wherein said second frequency converter comprises a reference signal generator for generating a reference signal and a mixer for multiplying the output signal from said D/A converter by the reference signal.

8. An A/D converter apparatus according to claim 5, wherein said first and second frequency converters comprise first and second quadrature modulators, respectively.

9. An A/D converter apparatus according to claim 8, wherein said first quadrature modulator comprises a first reference signal generator for generating first orthogonal reference signals and a pair of mixers supplied with the input signal and the quadrature signals for outputting first quadrature-modulated signals, respectively, and said second quadrature modulator comprises a second reference signal generator for generating second orthogonal reference signals, a pair of mixers supplied with the feedback signal and the second orthogonal reference signals for generating second quadrature-modulated signals, respectively, and an adder for adding the second quadrature-modulated signals together.

10. An A/D converter apparatus comprising:
    a negative feedback loop having a main signal line supplied with an input signal of a predetermined frequency and a feedback signal line receiving a feedback signal;
    A/D conversion means connected in said main signal line and having a first frequency conversion function for frequency-converting the input signal to a frequency-converted signal having a frequency different from that of the input signal;

D/A conversion means connected in said feedback signal line and having a second frequency conversion function for frequency-converting the feedback signal to a frequency-converted feedback signal having a frequency substantially equal to that of the input signal; and subtraction means for subtracting the frequency-converted feedback signal from said D/A conversion means from the input signal to supply a subtraction result signal to said A/D conversion means, and wherein said A/D conversion means comprises a first reference signal generator for generating first orthogonal reference signals and a pair of A/D converters connected in said main signal line for A/D-converting the input signal in accordance with the first orthogonal reference signals to output a pair of A/D-converted signals corresponding to the frequency-converted signal, and wherein said D/A conversion means comprises a pair of D/A converters connected in said feedback signal line for D/A converting feedback signals corresponding to the A/D-converted signals, a second reference signal generator for generating second orthogonal reference signals, a pair of mixers for multiplying D/A converted signals from said D/A converters by the second orthogonal reference signals, respectively, to output quadrature-modulated signals, and an adder for adding the quadrature-modulated signals from said mixers together to output the frequency-converted feedback signal.

11. An A/D converter apparatus according to claim comprising:

a negative feedback loop having a main signal line supplied with an input signal of a predetermined frequency and a feedback signal line receiving a feedback signal;

A/D conversion means connected in said main signal line and having a first frequency conversion function for frequency-converting the input signal to a frequency-converted signal having a frequency different from that of the input signal;

D/A conversion means connected in said feedback signal line and having a second frequency conversion function for frequency-converting the feedback signal to a frequency-converted feedback signal having a frequency substantially equal to that of the input signal; and subtraction means for subtracting the frequency-converted feedback signal from said D/A conversion means from the input signal to supply a subtraction result signal to said A/D conversion means, and wherein said A/D conversion means comprises a first reference signal generator for generating first orthogonal reference signals and a pair of mixers connected in said main signal line for multiplying the input signal by the first orthogonal reference signals to output quadrature-modulated signals, and a pair of A/D converters for A/D-converting the quadrature-modulated signals, and wherein said D/A conversion means comprises a second reference signal generator for generating second orthogonal reference signals, a pair of D/A converters connected in said feedback signal line for D/A-converting feedback signals corresponding to A/D-converted signals from said A/D converters in accordance with the second orthogonal reference signals to output quadrature A/D-converted signals, and an adder for adding the quadrature A/D-converted signals together to output the frequency-converted feedback signal.

12. An A/D converter apparatus comprising:

a negative feedback loop having a main signal line supplied with an input signal of a predetermined frequency and a feedback signal line receiving a feedback signal;

A/D conversion means connected in said main signal line and having a first frequency conversion function for frequency-converting the input signal to a frequency-converted signal having a frequency different from that of the input signal;

D/A conversion means connected in said feedback signal line and having a second frequency conversion function for frequency-converting the feedback signal to a frequency-converted feedback signal having a frequency substantially equal to that of the input signal; and subtraction means for subtracting the frequency-converted feedback signal from said D/A conversion means from the input signal to supply a subtraction result signal to said A/D conversion means, and wherein said A/D conversion means comprises a first reference signal generator for generating first orthogonal reference signals and a pair of A/D converters connected in said main signal line for A/D-converting the input signal in accordance with the first orthogonal reference signals to output a pair of A/D converted signals corresponding to the frequency-converted signal, and wherein said D/A conversion means comprises a second reference signal generator for generating second orthogonal reference signals, a pair of D/A converters connected in said feedback signal line for D/A-converting feedback signals corresponding to A/D-converted signals from said A/D converters in accordance with the second orthogonal reference signals to output quadrature A/D-converted signals, and an adder for adding the quadrature A/D-converted signals together to output the frequency-converted feedback signal.

* * * * *